US 8,324,930 B1

(12) United States Patent
Jenkins, IV

(10) Patent No.: US 8,324,930 B1
(45) Date of Patent: Dec. 4, 2012

(54) METHODS OF IMPLEMENTING OUTPUT PORTS AND AN INTEGRATED CIRCUIT HAVING PROGRAMMABLE OUTPUT PORTS

(75) Inventor: Jesse H. Jenkins, IV, Danville, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/891,578

(22) Filed: Sep. 27, 2010

(51) Int. Cl.
*H03K 19/173* (2006.01)
*H03K 19/00* (2006.01)

(52) U.S. Cl. .......................................... 326/38; 326/56

(58) Field of Classification Search .............. 326/37–47, 326/101, 56; 716/116, 117
See application file for complete search history.

(56) References Cited

U.S. PATENT DOCUMENTS

| | | | |
|---|---|---|---|
| 5,778,439 | A | 7/1998 | Trimberger et al. |
| 6,094,063 | A | 7/2000 | St. Pierre et al. |
| 6,366,117 | B1 | 4/2002 | Pang et al. |
| 6,429,682 | B1 | 8/2002 | Schultz et al. |
| 6,480,026 | B2 * | 11/2002 | Andrews et al. ............... 326/39 |
| 6,573,748 | B1 * | 6/2003 | Trimberger ..................... 326/38 |
| 7,420,392 | B2 | 9/2008 | Schultz et al. |
| 7,425,843 | B1 | 9/2008 | Edwards et al. |
| 7,509,617 | B1 | 3/2009 | Young |
| 7,928,760 | B2 * | 4/2011 | Bernasconi et al. ............ 326/38 |

OTHER PUBLICATIONS

U.S. Appl. No. 12/544,483, filed Aug. 20, 2009, McAndrew et al.
U.S. Appl. No. 12/544,493, filed Aug. 20, 2009, McAndrew et al.
U.S. Appl. No. 12/699,703, filed Feb. 3, 2010, Stewart et al.
Alfke, Peter et al., *XC3000 Series Technical Information*, XAPP024 (v1.0), Nov. 24, 1997, pp. 13-19 to 13-29, Xilinx, Inc., San Jose, California, USA.
Carmichael, Carl et al., *Correcting Single-Event Upsets Through Virtex Partial Configuration*, XAPP216 (v1.0), Jun. 1, 2000, pp. 1-12, Xilinx, Inc., San Jose, California, USA.
Lim, Davin et al., *Two Flows for Partial Reconfiguration: Module Based or Small Bit* Manipulations, XAPP290 (v1.0), May 17, 2002, pp. 1-23, Xilinx, Inc., San Jose, California, USA.
Lysaght, Patrick et al., "Invited Paper: Enhanced Architectures, Design Methodologies and CAD Tools for Dynamic Reconfiguration of Xilinx FPGAs," *Proc. of the 2006 International Conference on Field Programmable Logic and Applications*, Aug. 28, 2006, pp. 1-6, IEEE, Piscataway, New Jersey, USA.
Pashram, Vikram et al., *High-Speed DES and Triple DES Encryptp/Decryptor*, XAPP270 (v1.0), Aug. 3, 2001, pp. 1-12, Xilinx, Inc., San Jose, California, USA.
Xilinx, Inc., *Virtex-4 Configuration Guide*, UG071, copyright 1994, pp. 1-108, Xilinx, Inc., San Jose, California, USA.
Xilinx, Inc., *Virtex-4 Configuration Guide*, UG071 (v1.1), Sep. 10, 2004, pp. 1-108, Xilinx, Inc., San Jose, California, USA.
Xilinx, Inc., *Two Flows for Partial Reconfiguration: Module Based or Difference Based*, XAPP290 (v1.2), Sep. 9, 2004, pp. 1-28, Xilinx, Inc., San Jose, California, USA.

* cited by examiner

*Primary Examiner* — Thienvu Tran
(74) *Attorney, Agent, or Firm* — John J. King; Lois D. Cartier

(57) ABSTRACT

A method of implementing output ports of a programmable integrated circuit is disclosed. The method comprises coupling control signals to predetermined output ports of the integrated circuit; setting, by the control signals, initial output values of the predetermined output ports during programming of the programmable integrated circuit; and enabling normal operation of the predetermined output ports after the programming of the programmable integrated circuit. An integrated circuit having programmable output ports is also disclosed.

15 Claims, 7 Drawing Sheets

US 8,324,930 B1

METHODS OF IMPLEMENTING OUTPUT PORTS AND AN INTEGRATED CIRCUIT HAVING PROGRAMMABLE OUTPUT PORTS

FIELD OF THE INVENTION

The present invention relates generally to integrated circuits, and in particular, to methods of implementing output ports and an integrated circuit having programmable output ports.

BACKGROUND

When integrated circuits are implemented on a circuit board, the integrated circuits communicate after the circuit board is powered up. However, some integrated circuits may take longer to power up than other integrated circuits or devices on the circuit board. For example, some integrated circuits having programmable resources, such as programmable logic devices (PLDs) or any integrated circuit having programmable resources, require that configuration bits be downloaded to configuration memory of the integrated circuit to implement a given circuit design in the programmable resources. The operation of the circuit board may be affected by any delay encountered in loading the configuration bits into the configuration memory. For example, some devices on the circuit board may not be able to begin operation until all configuration bits are loaded into the configuration memory.

More particularly, some devices of a circuit board may not participate in early board behavior until a "DONE" signal is received from an integrated circuit which is loading configuration bits. Such a situation unnecessarily impedes the power-up cycle of the circuit board. While the DONE signal may be necessary for certain functions implemented by integrated circuits or other devices on the circuit board, it may be beneficial to implement other functions of certain integrated circuits or other device of the circuit board before the DONE signal is generated.

SUMMARY

A method of implementing output ports of a programmable integrated circuit is disclosed. The method comprises coupling control signals to predetermined output ports of the integrated circuit; setting, by the control signals, initial output values of the predetermined output ports during programming of the programmable integrated circuit; and enabling normal operation of the predetermined output ports after the programming of the programmable integrated circuit.

According to some embodiments, coupling control signals to predetermined output ports of the method may comprise loading a frame of configuration data. Further, setting initial output values of the predetermined output ports during programming of the programmable integrated circuit may comprise overriding tri-state buffer control signals of the predetermined output ports, or setting, for each output port of the predetermined output ports, an initial value of a tri-state buffer control signal coupled to a tri-state buffer of the output port. Setting an initial value of a tri-state buffer control signal may comprise selecting a fixed value as the tri-state buffer control signal. Setting initial output values of the predetermined output ports may comprises setting, for each output port of the predetermined output ports, an initial input value to the tri-state buffer. Enabling the normal operation of the predetermined output ports comprises coupling tri-state output buffer control signals to the predetermined output ports after programming the programmable integrated circuit.

According to an alternate embodiment, a method of implementing output ports of a programmable integrated circuit comprises receiving a plurality of frames of configuration data for programming the programmable integrated circuit; loading a first set of frames of the plurality of frames; setting initial output values of predetermined output ports of the programmable integrated circuit in response to loading the first set of frames; and enabling normal operation of the predetermined output ports after the plurality of frames have been loaded.

The method of the alternate embodiment may further comprise generating a DONE signal at another output port of the programmable integrated circuit. Enabling normal operation of the predetermined output ports may comprise enabling, in response to the DONE signal, the use of buffer control signals of the predetermined output ports. The method may further comprise coupling the predetermined output ports of the programmable integrated circuit to a plurality of devices of a circuit board, coupling the DONE signal to the plurality of devices, and starting operation of at least one predetermined device of the plurality of devices before receiving the DONE signal.

An integrated circuit having programmable output ports is also disclosed. The integrated circuit comprises an output port having an output buffer coupled to an output terminal; a control circuit coupled to the output buffer, the control circuit coupling a first output buffer control signal to the output buffer while configuration data is loaded in the integrated circuit and coupling a second output buffer control signal to the output buffer after the configuration data is loaded.

The output buffer of the integrated circuit may comprise a tri-state buffer. The first output buffer control signal may comprise a fixed signal coupled to a control terminal of the tri-state buffer and the second output buffer control signal may comprise a tri-state buffer control signal. The tri-state buffer may receive a tri-state control signal after the configuration data is loaded. The integrated circuit may further comprise a configuration circuit enabling configuration memory cells associated with input/output ports to be loaded in a first set of frames of configuration data. The control circuit may generate the second output buffer control signal in response to the DONE signal. The integrated circuit may further comprise a first register for setting the first output buffer control signal and a second register for setting an output at the output terminal while the configuration data is loaded.

DETAILED DESCRIPTION

Figure 1:
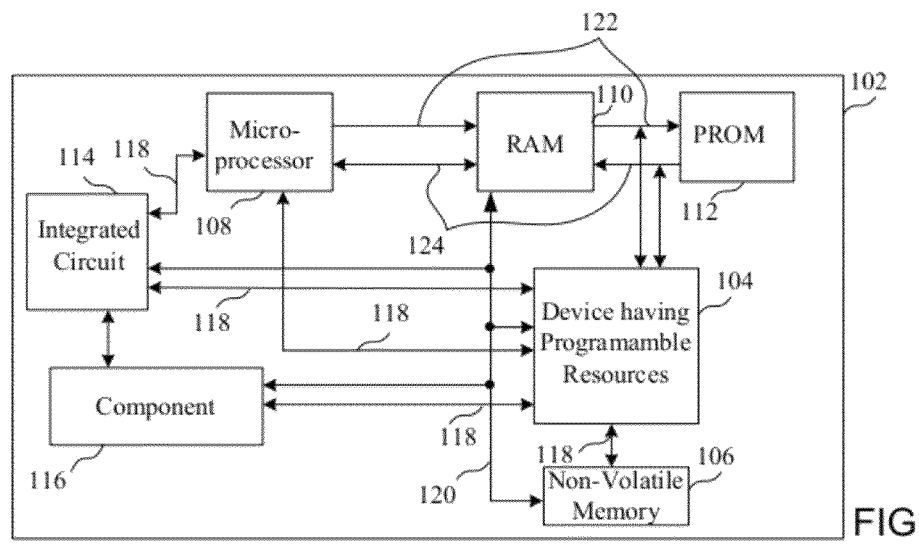
FIG. 1 is a block diagram of a system incorporating a device having programmable resources according to an embodiment.

Turning first to FIG. 1, a block diagram of a system incorporating a device having programmable resources according to an embodiment is shown. A circuit board 102 comprises a number of devices which are coupled either by direct connections or buses. According to the example of FIG. 1, a programmable integrated circuit 104 may be coupled to any number of the other devices on the circuit board by way of direct connections between the programmable integrated circuit 104 and other devices, or by way of buses. An example of a programmable integrated circuit will be described in more detail in reference to FIGS. 2 and 3. Configuration bits for configuring the programmable resources may be loaded in the programmable integrated circuit 104 by way of a non-volatile memory 106. The circuit board may also comprise a microprocessor 108, a random access memory (RAM) 110, a programmable read only memory (PROM) 112, and another integrated circuit 114 or component 116. The devices may be connected by direct interconnects implemented using conductive traces on the board, as is well known. Examples of such direct interconnects are shown as interconnects 118.

An interconnect 120 from the programmable integrated circuit 104 to other devices on the circuit board is designated to provide a "DONE" signal generated by the programmable integrated circuit 104. The DONE signal indicates that the configuration bits have been fully loaded into the device. The generation and use of the DONE signal will be described in more detail below. While the DONE signal is shown being routed to the devices of the circuit board using interconnect 120, it should be understood that the DONE signal could be routed to the predetermined devices using other means, such as separate direct connections to the other devices or by way of a bus. Finally, an address bus 122 and a data bus 124 enable the communication of data between the RAM 110 or PROM 112 and other devices on the circuit board, such as the programmable integrated circuit 104 or the microprocessor 108. While FIG. 1 is provided to describe the interaction of devices on a circuit board, it should be understood that other devices could be employed on the circuit board, or coupled to communicate according to different means.

During a power-up cycle of a circuit board, only some portions of a circuit implemented in the programmable integrated circuit (i.e. some portions enabled by the configuration bits downloaded to the configuration memory of the programmable integrated circuit) may be required by the devices of the circuit board. Accordingly, it is not necessary that all of the configuration bits be downloaded before the devices of the circuit board 102 interact with the programmable integrated circuit 104. As will be described in more detail below, the programmable integrated circuit 104 is implemented to enable generating certain output signals which are coupled to other devices on the board before the DONE signal is generated by the programmable integrated circuit. As will also be described, certain configuration bits may be implemented as control signals for enabling certain output signals to be generated at outputs ports of the programmable integrated circuit during programming.

When a "Power-on-Reset" (POR) is performed in a programmable integrated circuit, a configuration circuit of the programmable integrated circuit starts a configuration process. According to one embodiment, a user may have an option of loading certain frames immediately upon completion of POR inside the programmable integrated circuit, permitting the programmable integrated circuit to directly drive signals to the circuit board. One variable in performing the POR will be the POR time (i.e. the time delay to drive the outputs) of the specific programmable integrated circuit. According to one embodiment, the POR could be interleaved with output configuration loading, so that the frames associated with the output ports are reset first, then configured and driven out, before the rest of the integrated circuit is reset and configured for even faster output availability. This approach would make all programmable integrated circuits have the same, fast enabled outputs regardless of the density of the integrated circuit.

Figure 2:
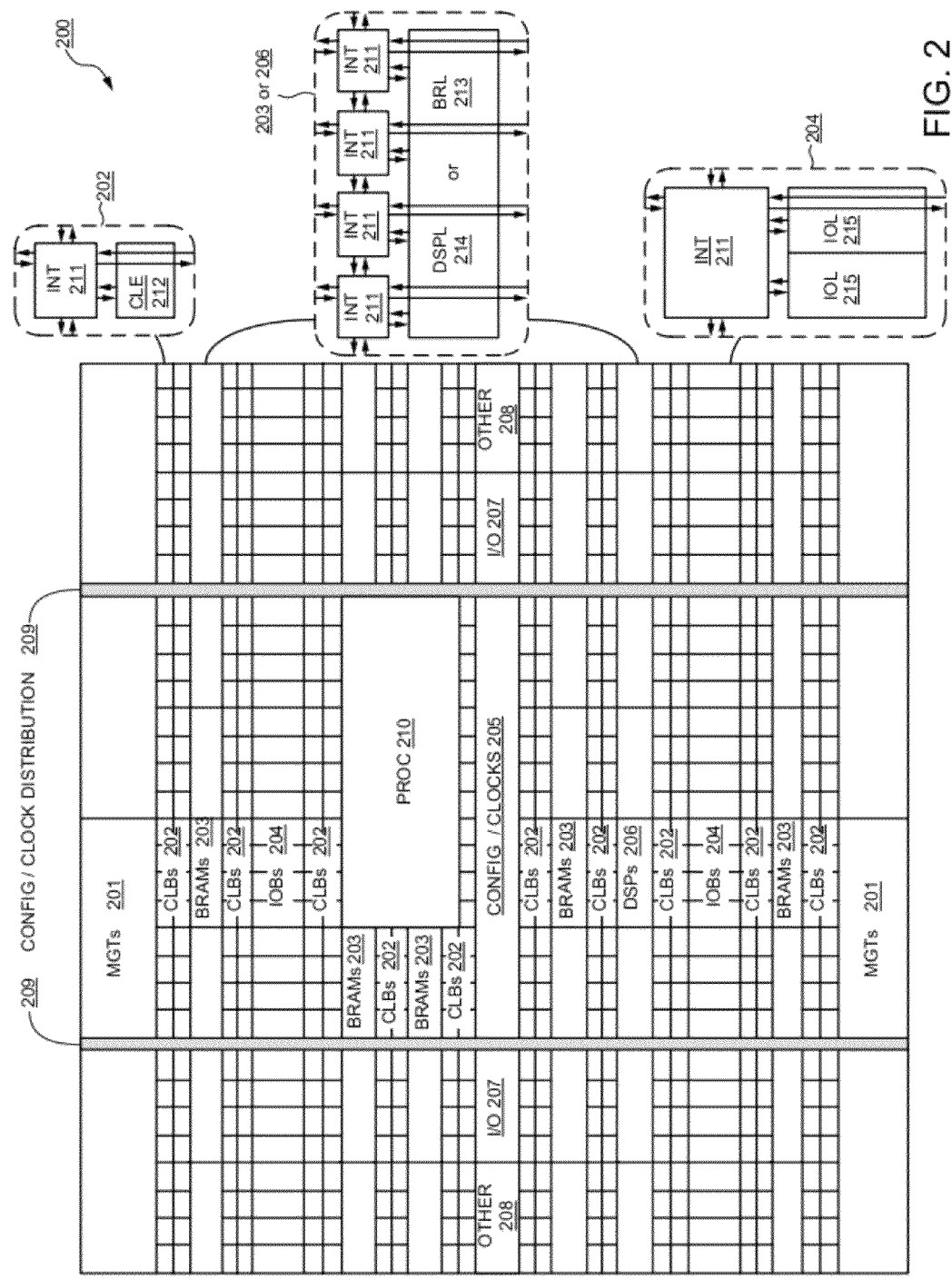
FIG. 2 is a block diagram of a device having programmable resources according to an embodiment.

Turning now to FIG. 2, a block diagram of a device having programmable resources according to an embodiment is shown. While programmable resources may be implemented in any type of integrated circuit, such as an application specific integrated circuit (ASIC) having programmable resources, other devices comprise substantial portions of programmable resources. A PLD is one type of integrated circuit device designed to be user-programmable so that users may implement logic designs of their choices. A Complex Programmable Logic Device (CPLD) is one type of PLD which includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

Some aspects of the various embodiments described below find particular application in FPGAs or devices having operating characteristics similar to an FPGA. CPLDs are well known for their "instant on" behavior as the various power supplies are stabilizing during initial power on. This "instant on" behavior is useful in many systems to control other devices on a circuit board. In implementing any type of integrated circuit on a circuit board, there is seldom a need that the entire circuitry of an integrated circuit be operating during the unstable power-up cycle of circuit board operation. However, having the outputs come up in a known, user-defined state and remain stable helps control the rest of the circuit board.

Accordingly, the methods and circuits of the various embodiments find particular application in FPGAs or other devices which may take a longer time to power up than a CPLD, for example.

Further, some devices on circuit boards may be configured to wait for a programmable integrated circuit to be fully configured. For example, some conventional FPGAs generate a "DONE" signal to indicate the completion of the configuration process. This "DONE" signal is often used to gate the activity of other integrated circuits on the board until the FPGA is fully configured and enabled. Accordingly, the behavior of conventional FPGAs often precludes them from participating in the early board behavior. By offering an option of altering the order of loading configuration bit frames, FPGAs can load frames which drive output pins ahead of the other frames, and enable the signals to drive out to the board. The other integrated circuits or devices on the board, which may otherwise wait for a DONE signal from a programmable integrated circuit, are programmed to proceed with start-up or other processing before a DONE signal is received. While they may take further actions in response to the DONE signal, they will start some operations before receiving the DONE signal.

The device of FIG. 2 comprises an FPGA architecture 200 having a large number of different programmable resources implemented as programmable tiles, including multi-gigabit transceivers (MGTs) 201, CLBs 202, random access memory blocks (BRAMs) 203, IOBs 204, configuration and clocking logic (CONFIG/CLOCKS) 205, digital signal processing blocks (DSPs) 206, specialized input/output blocks (I/O) 207 (e.g., configuration ports and clock ports), and other programmable logic 208 such as digital clock managers, analog-to-digital converters, system monitoring logic, and so forth. Some FPGAs also include dedicated processor blocks (PROC) 210, which may be used to implement a software application, for example.

In some FPGAs, each programmable tile includes a programmable interconnect element (INT) 211 having standardized connections to and from a corresponding interconnect element in each adjacent tile. Therefore, the programmable interconnect elements taken together implement the programmable interconnect structure for the illustrated FPGA. The programmable interconnect element 211 also includes the connections to and from the programmable logic element within the same tile, as shown by the examples included at the top of FIG. 2.

For example, a CLB 202 may include a configurable logic element (CLE) 212 that may be programmed to implement user logic plus a single programmable interconnect element 211. A BRAM 203 may include a BRAM logic element (BRL) 213 in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 206 may include a DSP logic element (DSPL) 214 in addition to an appropriate number of programmable interconnect elements. An IOB 204 may include, for example, two instances of an input/output logic element (IOL) 215 in addition to one instance of the programmable interconnect element 211. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a horizontal area near the center of the die is used for configuration, clock, and other control logic. Vertical areas 209 extending from this column are used to distribute the clocks and configuration signals across the breadth of the FPGA. Some FPGAs utilizing the architecture illustrated in FIG. 2 include additional logic blocks that disrupt the regular columnar structure making up a large part of the FPGA. The additional logic blocks may be programmable blocks and/or dedicated logic. For example, the processor block PROC 210 shown in FIG. 2 spans several rows of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Figure 3:
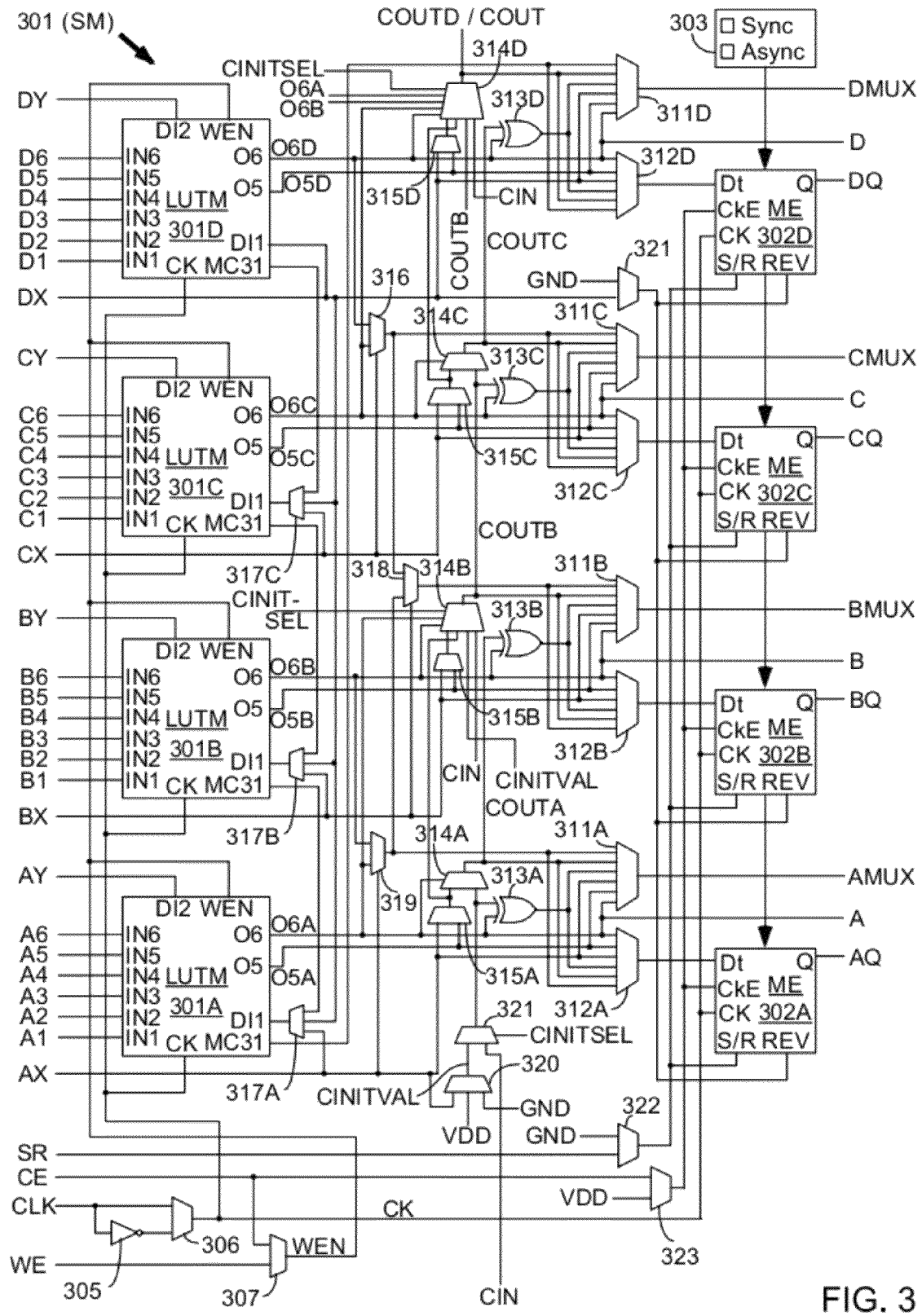
FIG. 3 is a block diagram of a configurable logic element of the device of FIG. 1 according to an embodiment.

Turning now to FIG. 3, a block diagram of configurable logic elements of the device of FIG. 2 according to an embodiment is shown. In particular, FIG. 3 illustrates in simplified form a configurable logic element of a configuration logic block 202 of FIG. 2. In the embodiment of FIG. 3, slice M 300 includes four lookup tables (LUTMs) 301A-301D, each driven by six LUT data input terminals A1-A6, B1-B6, C1-C6, and D1-D6 and each providing two LUT output signals O5 and O6. The O6 output terminals from LUTs 301A-301D drive slice output terminals A-D, respectively. The LUT data input signals are supplied by the FPGA interconnect structure via input multiplexers, which may be implemented by programmable interconnect element 311, and the LUT output signals are also supplied to the interconnect structure. Slice M also includes: output select multiplexers 311A-311D driving output terminals AMUX-DMUX; multiplexers 312A-312D driving the data input terminals of memory elements 302A-302D; combinational multiplexers 316, 318, and 319; bounce multiplexer circuits 322-323; a circuit represented by inverter 305 and multiplexer 306 (which together provide an optional inversion on the input clock path); and carry logic comprising multiplexers 314A-314D, 315A-315D, 320-321 and exclusive OR gates 313A-313D. All of these elements are coupled together as shown in FIG. 3. Where select inputs are not shown for the multiplexers illustrated in FIG. 3, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 3 for clarity, as well as from other selected figures herein.

In the pictured embodiment, each memory element 302A-302D may be programmed to function as a synchronous or asynchronous flip-flop or latch. The selection between synchronous and asynchronous functionality is made for all four memory elements in a slice by programming Sync/Asynch selection circuit 303. When a memory element is programmed so that the S/R (set/reset) input signal provides a set function, the REV input terminal provides the reset function. When the memory element is programmed so that the S/R input signal provides a reset function, the REV input terminal provides the set function. Memory elements 302A-302D are clocked by a clock signal CK, which may be provided by a global clock network or by the interconnect structure, for example. Such programmable memory elements are well known in the art of FPGA design. Each memory element 302A-302D provides a registered output signal AQ-DQ to the interconnect structure. Because each LUT 301A-301D provides two output signals, O5 and O6, the LUT may be configured to function as two 5-input LUTs with five shared input signals (IN1-IN5), or as one 6-input LUT having input signals IN1-IN6.

In the embodiment of FIG. 3, each LUTM 301A-301D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 317A-317C for LUTs 301A-301C), or to the two 32-bit RAMs via input terminals DI1 and DI2. RAM write operations in the LUT RAMs are controlled by clock signal CK from multiplexer 306 and by write enable signal WEN from multiplexer 307, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 301A may also be provided to the general interconnect structure for shift register chaining, via output select multiplexer 311D and CLE output terminal DMUX. The devices having programmable resources and methods described may be implemented according to the device of FIGS. 2 and 3, or in any device, including any type of integrated circuit, having programmable resources used to implement at least a portion of a circuit design.

Figure 4:
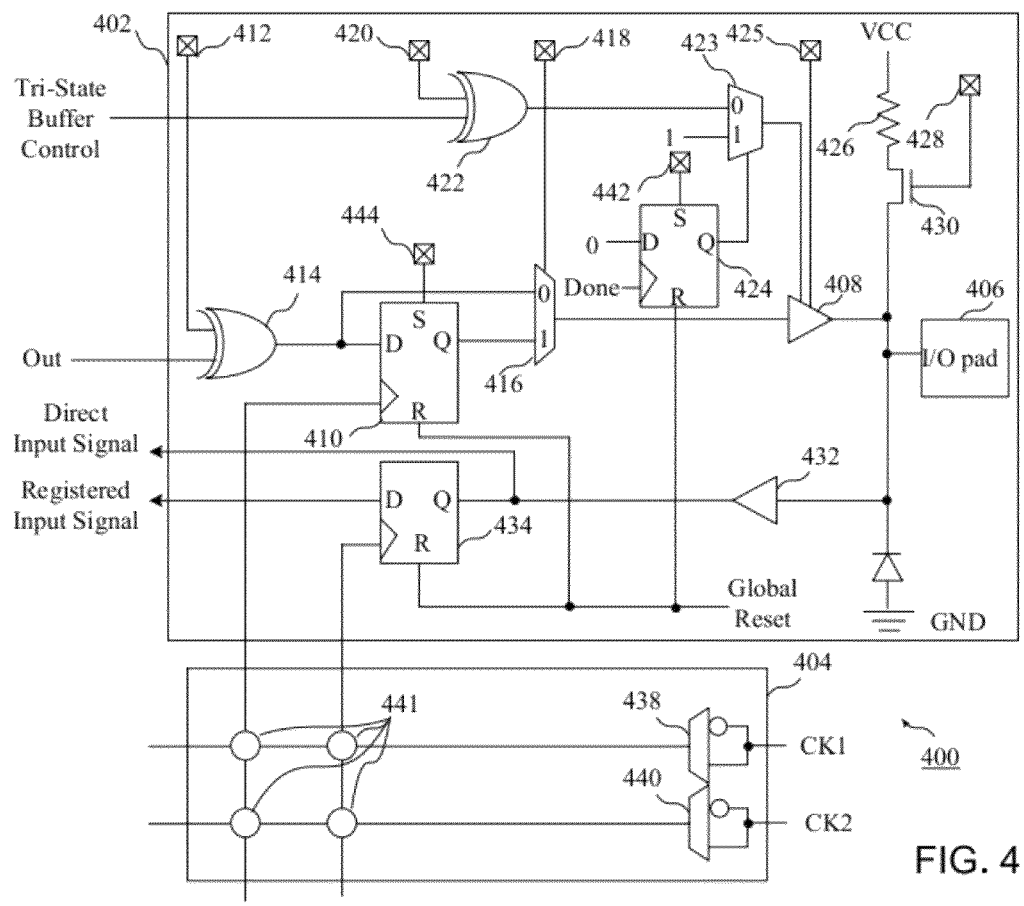
FIG. 4 is a block diagram of an input/output port according to an embodiment.

Turning now to FIG. 4, a block diagram of an input/output (I/O) port 400 according to an embodiment is shown. The I/O port of FIG. 4 may be implemented in an IOB 204 of FIG. 2, for example, and includes an I/O portion 402 and a clock control portion 403. The I/O portion 402 includes an I/O terminal 406 for receiving an input signal or generating an output signal. The I/O portion 402 also includes a tri-state output driver 408 that may be driven directly or by a registered value in a register 410. The polarities of both the output data and the tri-state control signal may be determined by configuration bits. In particular, an output data bit (Out) and an output invert control bit 412 are coupled to an exclusive OR (XOR) gate 414. The Out signal is coupled to the I/O portion 402 from the programmable resources or other circuits of the programmable integrated circuit. The output of the XOR gate 414 is coupled to the input of the register 410 or directly to a multiplexer 416. An output select control bit 418 is coupled to control the multiplexer 416 to enable the multiplexer to select either the output of the register 410 or the output of the XOR gate 414. The output may also be tri-stated. In order to enable the tri-stating of the output driver 408, a tri-state buffer control signal and a tri-state invert bit 420 are coupled to an XOR gate 422, the output of which is coupled by way of a multiplexer 423 to control the output driver 408. In particular, the output of the XOR gate 422 is coupled to a first input of the multiplexer 423 which also receives a logical "1" at a second input. The multiplexer 423 is controlled by a register 424.

Each output buffer may also be configured to have either a fast or a slow slew rate according to a slew rate bit 425.

Additionally, the I/O portion may be configured as a latch. When an I/O port is used exclusively as an input, an optional pull-up resistor 426 may be selected by way of a passive pull up bit 428 and coupled to the gate of a transistor 430. The resistor 426 is decoupled when the I/O block is configured as an output or as a bidirectional pin. The I/O terminal 406 is also coupled to an input driver 432, the output of which is coupled to a register 434. Accordingly, a direct input signal or a registered input signal may be generated and coupled to programmable resources of the integrated circuit. The values of output invert control bit 412, output select control bit 418, tri-state invert bit 420, slew rate bit 425, and passive pull up bit 428 may be stored in configuration memory elements which are set by configuration bits of a configuration bitstream, while the tri-state buffer control signal may be generated by the programmable resources or other circuits of the programmable integrated circuit. While the I/O port 400 may receive input signals as described above, input signals may remain blocked until configuration of the integrated circuit is finished.

The clock control portion 404 includes a first multiplexer 438 coupled to receive a first clock (CK1) and an inverted first clock, and a second multiplexer 440 coupled to receive a second clock (CK2) and a inverted second clock. Programmable interconnect points 441 enable routing a desired clock signal of the various clock signals to the registers 410 and 434 and other portions of the integrated circuit.

In operation, the I/O port 400 of FIG. 4 enables driving a known logic value to the I/O terminal 406 using configuration bits. That is, by loading a first set of frames having configuration bits associated with I/O ports implemented as output ports, desired output values can be loaded at the output ports. The first set of frames may be a single frame or multiple frames. More particularly, a set bit 442 coupled to a set input (S) of the register 424 enables an initial control signal of a logical "1" to control the multiplexer 423. That is, while programming the programmable resources of the integrated circuit by loading configuration bits, an initial value of a control signal coupled to the multiplexer 423 is selected to generate a first output buffer control signal coupled to a control terminal of the tri-state buffer 408. According to the embodiment shown in FIG. 4, the first output buffer control signal is a fixed value and bypasses the tri-state buffer control signal which otherwise be coupled to control the tri-state buffer 408 during normal operation of the I/O port (i.e. after programming the programmable integrated circuit). According to the embodiment of FIG. 4, the set bit 442 is selected to generate a logical "1" at the output of the register 424, and therefore select the logical "1" input to the multiplexer 423 to disable the tri-state operation of the tri-state buffer 408. By disabling the tri-state operation of the tri-state buffer 408, an output may be generated at the I/O terminal 406 during configuration.

However, because the entire circuit of the integrated circuit has not yet been programmed, the "Out" value to be coupled to the I/O terminal 406 may not be valid. Accordingly, it is necessary to couple the desired value to the I/O terminal 406 during the programming of the integrated circuit. Therefore, another set bit 444 provided by a configuration bit of a configuration bitstream is coupled to the I/O portion 402. More particularly, the set bit 444 is selected to set the desired output at the I/O terminal 406. The output select control bit 418 is set to a logical "1" to select the output of the register 410. Accordingly, the output select control bit 418 and the set bits 442 and 444 may be implemented as a part of a control circuit comprising multiplexer 423 and register 424 which generates control signals while programming the integrated circuit.

After the remaining frames have been loaded, the DONE signal generated by a configuration circuit, as will be described in more detail below. The DONE signal is coupled to the clock input of the register 424, enabling the logical "0" on the input of the register to be coupled to the control the multiplexer 423. The logical "0" on the control terminal of the multiplexer 423 enables a second output control signal to be applied to the output buffer. That is, when the DONE signal goes high, the logical "0" at the input of the register is coupled to the control terminal of the multiplexer 423, enabling the tri-state buffer control signal to control the output buffer. Accordingly, after the configuration is complete, the tri-state buffer control signal, coupled to the I/O portion 402, will be coupled control the tri-state buffer 408 during normal operation of the I/O port. That is, unlike the fixed value coupled to the multiplexer 423, the tri-state buffer control signal coupled to the I/O portion 402 may vary as desired during normal operation of the circuit.

While the circuit of FIG. 4 shows one example of an I/O port which may be implemented according to the various embodiments, it should be understood that other I/O ports or variations of the I/O port of FIG. 4 may be implemented. It should be further understood that, while the circuit of FIG. 4 is shown as a combined input and output port, the output control function provided by the register 410, multiplexer 423 and register 424 could be implemented in a dedicated output port where the input buffer 432 and register 434 are not included. Alternatively, all of the ports of the integrated circuit which may transmit or receive signals may be combined I/O ports, and may be configured to operate as either an input port or an output port. While multiplexer 423 and the register 424 are shown as a part of the I/O portion 402, they could be implemented separate from the I/O port 400. It should be further understood that some circuits of the programmable integrated circuit may be reconfigured during a partial reconfiguration. For example, the output select control bit 418, which is initially set to select the output of the register 410 during programming of the integrated circuit, may be reprogrammed during a partial reconfiguration to select the unregistered output of the XOR gate 414.

Figure 5:
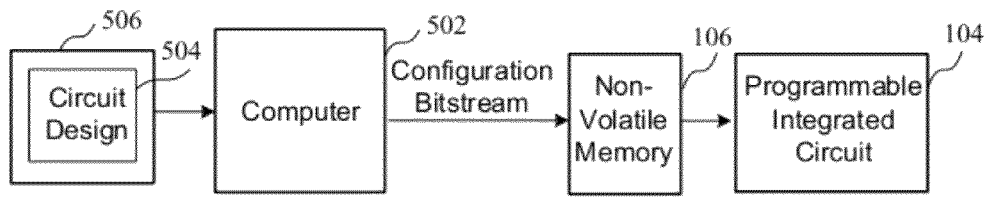
FIG. 5 is a block diagram of a system for programming a device having programmable resources according to an embodiment.

Turning now to FIG. 5, a block diagram of a system for programming a device having programmable resources according to an embodiment is shown. In particular, a computer 502 is coupled to receive a circuit design 504 from a memory 506, and generate a configuration bitstream which is stored in the non-volatile memory 106. As will be described in more detail below, the circuit design may be a high level design, such as a circuit design defined in a hardware description language (HDL) such as VHDL. Also, the computer may be configured to run software that generates a configuration bitstream which is stored in the non-volatile memory 106.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 502 may implement the portions of a circuit design implementing certain functions in CLBs or DSP blocks, for example. An example of a synthesis tool is the ISE tool available from Xilinx, Inc. of San Jose Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit.

At the end of place and route, all functions, positions and connections are known, and a configuration bitstream is then created. The bitstream may be created by a software module called BitGen, available from Xilinx, Inc., of San Jose, Calif. The bitstream is either downloaded by way of a cable or programmed into an EPROM for delivery to the programmable integrated circuit. The bitstream can be viewed as an alternate image of the FPGA shown in FIG. 3. That is, underneath the arrangement of elements of FIG. 3 is a separate bit framework forming the connections, filling the LUTs and BRAMS, as well as various registers within DCMs, multipliers, and MGTs, for example. This bit framework, and the configuration of the bit framework will be described in detail in FIG. 6. More particularly, methods of loading the configuration bits associated with the I/O ports to enable quickly generating signals at the output ports will also be described.

Figure 6:
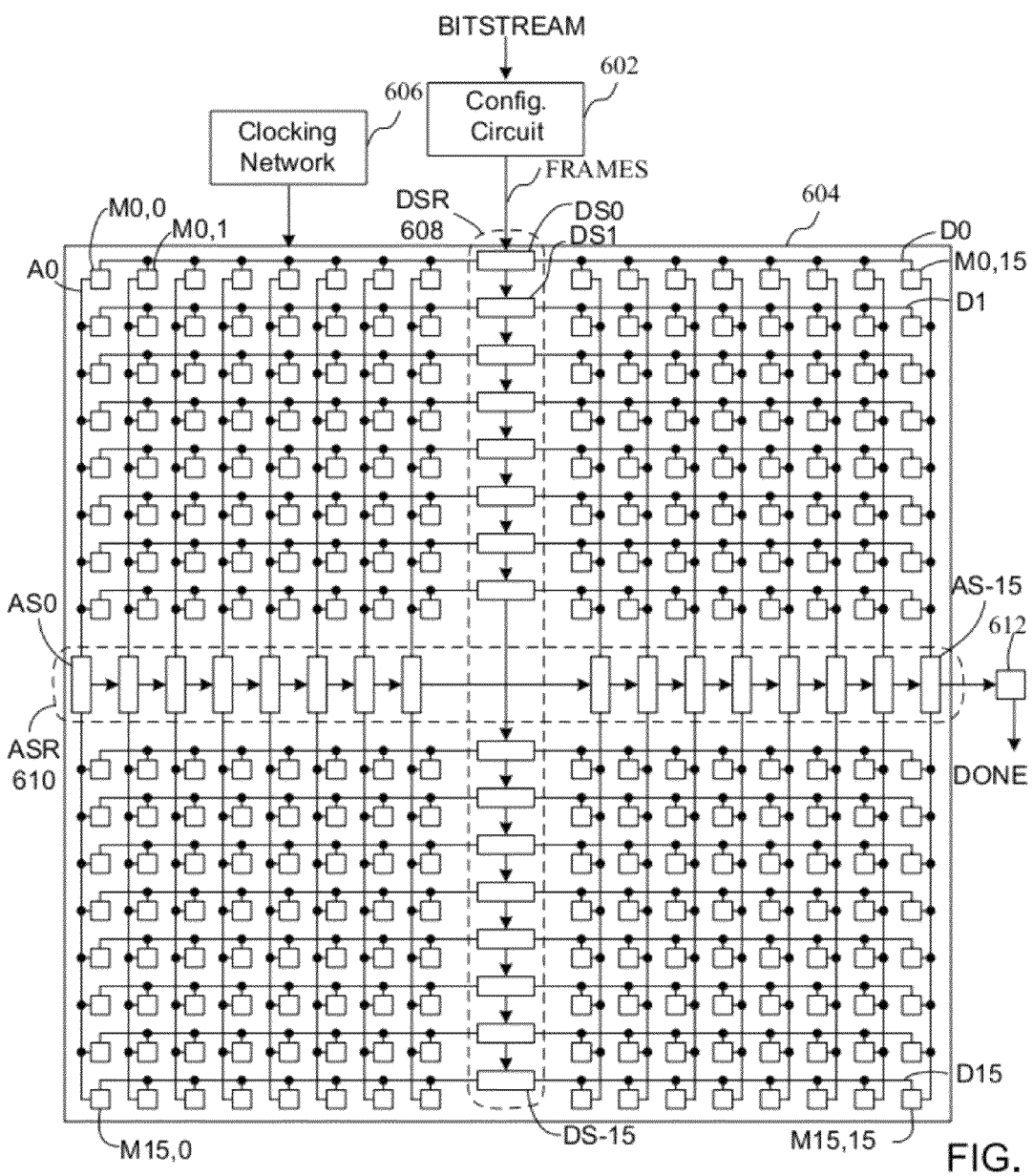
FIG. 6 is a block diagram of a circuit enabling the configuration of a device having programmable resources according to an embodiment.

Turning now to FIG. 6, a block diagram of a circuit enabling the configuration of a programmable integrated circuit according to an embodiment is shown. The circuit of FIG. 6 generally comprises a configuration circuit 602 and a configuration memory 604 coupled to receive the configuration bits from the configuration circuit 602. The configuration circuit 602 receives the bitstream, and disperses frames of configuration bits of the bitstream to various configuration memory cells according to a predetermined protocol using a clocking network 606. The configuration circuit 602 enables loading the configuration bitstream by way of a central data shift register (DSR) 608. DSR 608 is a length of a frame, which will be the fundamental data item transferred. As shown in FIG. 6, the DSR 608, which is connected in parallel to all cells of the configuration memory, captures a frame. The DSR 608 outputs connect to the parallel inputs of the various configuration memory cells in the rows. The configuration process is simply extracting frames of data from the incoming bitstream, identifying the correct columns to receive the frames, dispatch them until all of the frames have been loaded.

The configuration memory 604 of FIG. 6 is shown by way of example as a 16-bit by 16-bit array, which includes 256 configuration memory cells. In general, each of the configuration memory cells is identified by a reference character Mx,y, where x and y correspond to the row and column, respectively, of the configuration memory cell. An array of configuration memory cells in a typical device has on the order of millions of memory cells. Therefore, the array of FIG. 6 is much smaller than is typically used, but nevertheless shows the structure of a configuration memory which could be employed according to the various embodiments.

To load configuration data into the configuration memory 604, the configuration bitstream is shifted through the DSR 608 under control of the clocking network 606 until a 16 bit wide frame of data has been shifted into bit positions DS0 through DS15 of the DSR 608. The frame of data is then shifted in parallel on data lines D0 through D15 into a column of configuration memory cells addressed by address shift register (ASR) 610. The column may be addressed, for example, by shifting a token high bit through the ASR 610 to the desired column. As set forth above, frames of configuration data associated with I/O ports are loaded first, enabling the integrated circuit to generate output signals at output ports before the entire configuration bitstream is loaded. When all of the frames have been loaded, a circuit 612 is activated to generate the DONE signal. The DSR 608 and ASR 610 which are shown circled in dashed lines and the circuit 612 may be a part of the configuration circuit 602. An example of a control circuit 602 which could be implemented according to the various embodiments is shown and described in FIG. 4 of U.S. Pat. No. 6,429,682, the entire patent of which is incorporate by reference herein.

Figure 7:
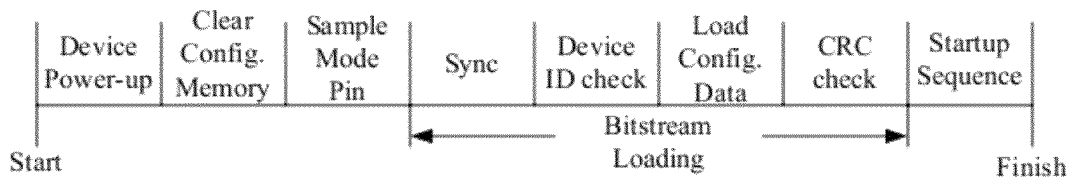
FIG. 7 is a diagram showing stages of programming a device having programmable resources according to an embodiment.

While a circuit for loading a configuration bitstream and the general operation of a loading a configuration bitstream has been shown and described in reference to FIG. 6, a more detailed operation of loading a configuration bitstream will be described in reference to FIG. 7. The diagram of FIG. 7 summarizes stages of programming an integrated circuit having programmable resources. At power up, the various configuration cells and state machines are not capable of correct electronic action until sufficient voltage and current are available from external power regulators. Depending on the integrated circuit, the precise voltages will be different for the various activities. In general, there is a recognition voltage where internal state machines trigger and take appropriate action. Once the proper voltage arrives, a state machine triggers and the configuration circuit automatically cycles through its address space of configuration frames, writing zeroes into all the memory cells during a POR. Zeroing the memory cells eliminates the possibility of internal contention, which might damage the integrated circuit. Zeroing the memory cells may be performed twice to assure proper initialization. After zeroing the memory cells of the configuration memory, the configuration memory samples mode pins to continue the configuration process according to a selected mode of configuration.

The configuration bitstream includes a synchronization word to guarantee correct reading of the synchronization data at a previously specified clock period. If synchronization word is read correctly, it is necessary to ensure that the bits which follow are for the receiving integrated circuit. Therefore, a device ID is next checked. For example, the device ID may be checked against an ID stored in the programmable integrated circuit. The ID may be specific to a specific device, a type of device, or even a family of devices. Because frame sizes and bit arrangements may vary among different devices in a family of devices, this check is critical to ensure that data frames are not inadvertently loaded into the wrong device.

Figure 8:
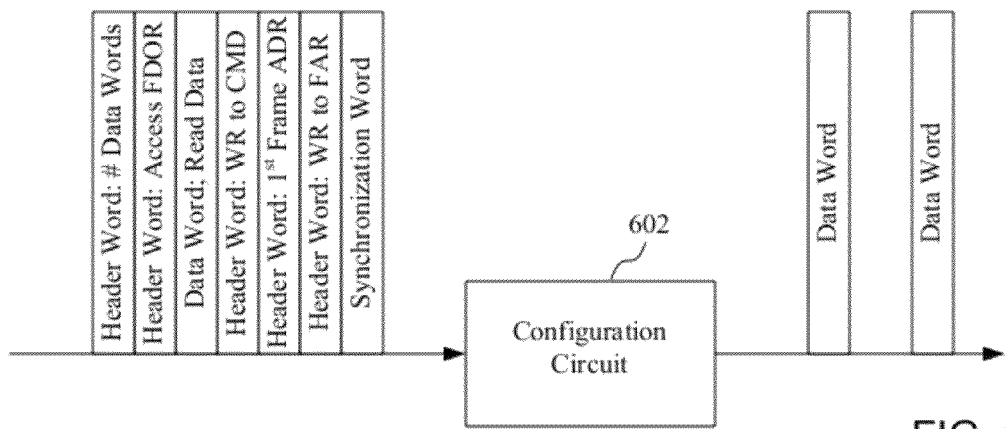
FIG. 8 is a diagram showing the generation of data words from a configuration bitstream according to an embodiment.

Assuming synchronization and device ID check are satisfied, the configuration payload is then loaded. The configuration payload bits include not only the configuration data (e.g. the bits which are used to configure CLBs, BRAMs, etc.), but also instructions and parameters for a set of specific actions that the configuration circuit must take to load the configuration data. As shown in FIG. 8, both control words and data words are provided in the configuration payload to enable the correct loading of the frames of data in the configuration memory 604. According to aspects of the various embodiments, the control words and data words of the configuration payload will be arranged to load the configuration data for the I/O ports first, as set forth above. Through the duration of bitstream delivery, a CRC state machine within the integrated circuit tallies a finite field calculation that is unique for the delivered bitstream, and serves as a signature at the end of the process. At the end of the bitstream delivery, the integrated circuit calculated CRC value must match the one appended to the bitstream at the end of the process, or an error condition is flagged into an configuration controller error register. If the CRC values match, an active high DONE signal is generated to indicate that all of the configuration bits have been successfully loaded.

According to one aspect of the various embodiments, the clearing of configuration memory cells could be interleaved with configuration loading for the output ports. That is, the configuration data of configuration memory cells associated with output ports are reset first, then configured and driven out, before the rest of the integrated circuit is reset and configured. Such a sequence of configuring data will result in even faster output availability. Further, all programmable integrated circuit will have the same, fast enabled outputs regardless of the density of the integrated circuit.

Figure 9:
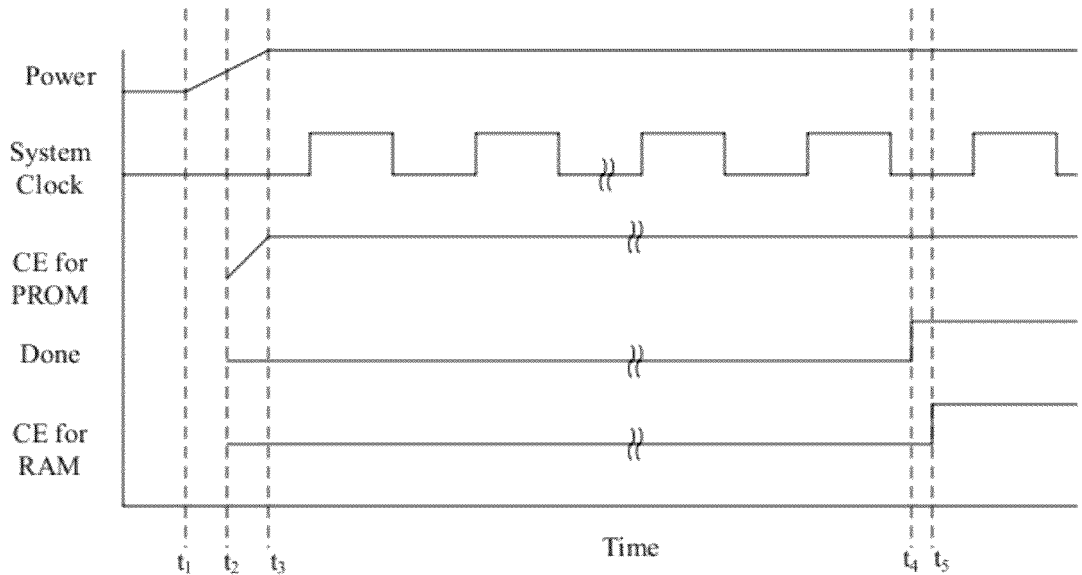
FIG. 9 is a timing diagram showing the operation of a system having programmable resources according to an embodiment.

Turning now to FIG. 9, a timing diagram shows the operation of a system having programmable resources according to an embodiment. One benefit of the circuits and methods of the various embodiments is that various devices on a board may be able to use output data of a programmable integrated circuit before the entire integrated circuit is programmed. An example based upon the devices on the circuit board of FIG. 1 is provided in FIG. 9. In particular, at power-on of the circuit board at a time $t_1$, the system begins to power up. At a time $t_2$, the power has increased enough to enable the chip enable (CE) signal to the PROM, generated by the programmable integrated circuit, for the PROM to start to ramp up. At a time $t_3$, the CE signal for the PROM is generated, enabling the PROM. As can be seen, the PROM is able to function prior to the generation of the DONE signal at a time $t_4$. At a time $t_5$, the CE signal for the RAM is then generated in response to the DONE signal.

Figure 10:
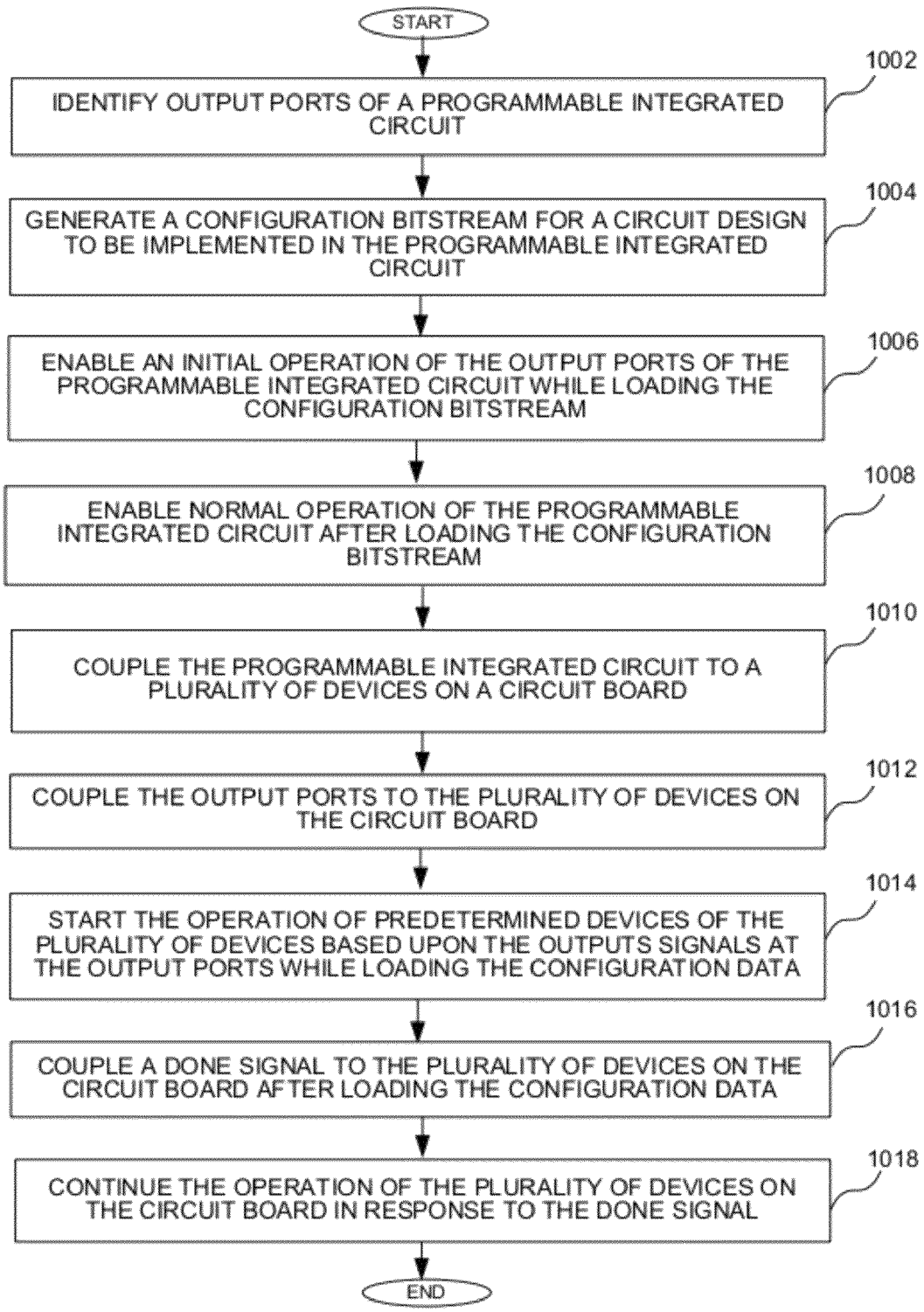
FIG. 10 is a flow chart showing a method of operating a system having a programmable integrated circuit according to an embodiment.

Various methods of implementing output ports of a programmable integrated circuit are now described. The methods may be implemented using the circuits as described in FIGS. 1-9, or other suitable circuits. While various aspects of the methods are disclosed, it should be understood that additional details related to the specific steps of FIGS. 10-12 or additional steps may be found in the description of FIGS. 1-9. Turning first to FIG. 10, a flow chart shows a method of operating a system having a programmable integrated circuit according to an embodiment. In particular, output ports of a programmable integrated circuit are identified at a step 1002. More particularly, if the ports are implemented as I/O ports, it may be necessary to identify which I/O ports are to be used as output ports. Alternatively, all I/O ports may be initially provided as a dedicated output port. A configuration bitstream for a circuit design to be implemented in the programmable integrated circuit is then generated at a step 1004. As set forth above, the configuration bitstream will be generated to enable the output ports to be configured first. An initial operation of the output ports of the programmable integrated circuit is enabled while loading the configuration bitstream at a step 1006. Normal operation of the programmable integrated circuit is then enabled after loading the configuration bitstream at a step 1008. The programmable integrated circuit is coupled to a plurality of devices on a circuit board at a step 1010, and the output ports are coupled to the plurality of devices on the circuit board at a step 1012. The operation of the devices on the circuit board is started based upon the output signals at the output ports at a step 1014. A DONE signal is then coupled to the plurality of devices on the circuit board at a step 1016. Finally, at a step 1018, the operation of the plurality of devices on the circuit board is continued in response to the DONE signal, at which time the signals at the output terminals may change.

Figure 11:
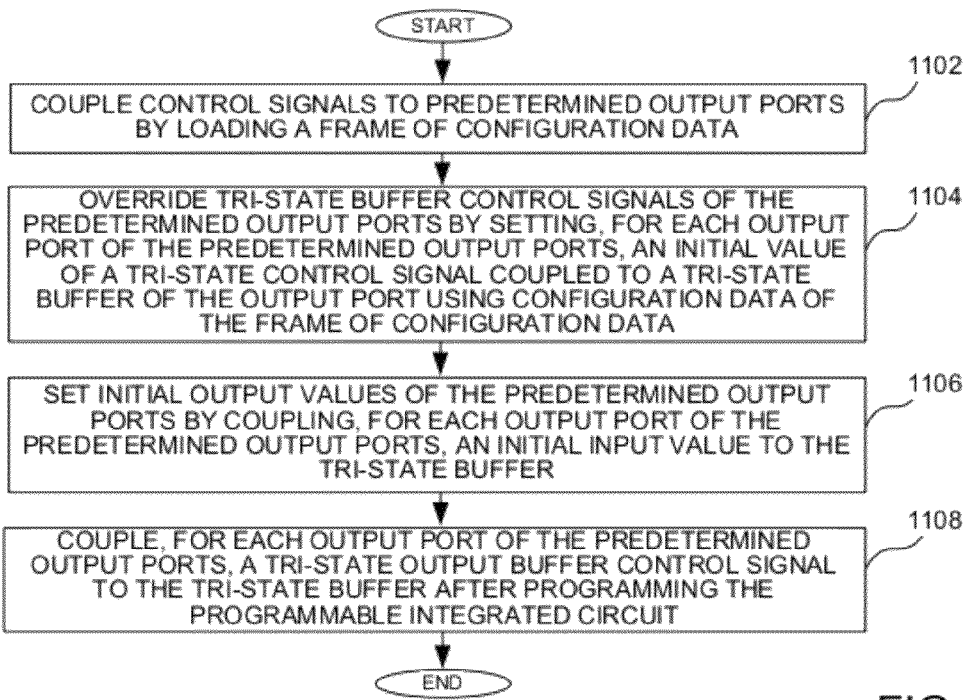
FIG. 11 is a flow chart showing a method of enabling an initial operation of output ports of a programmable integrated circuit according to an embodiment.
Figure 12:
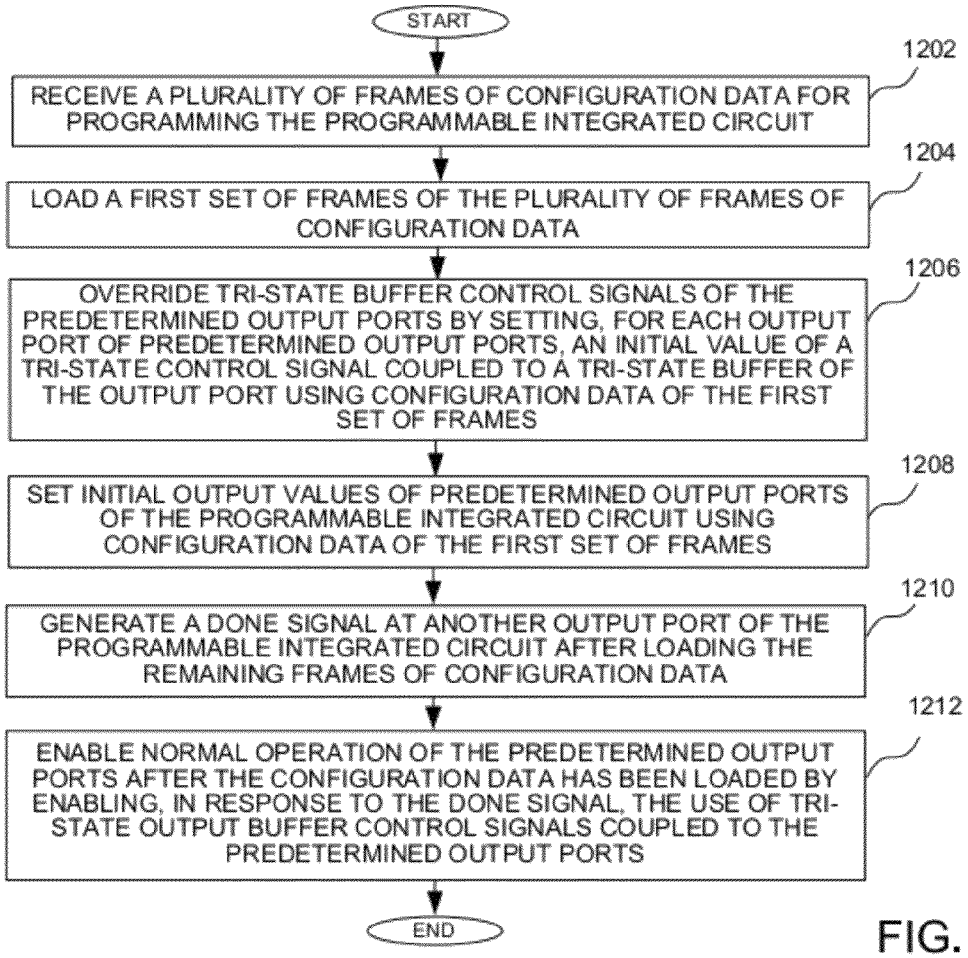
FIG. 12 is a flow chart showing a method of enabling an initial operation of output ports of a programmable integrated circuit according to an alternate embodiment.

Enabling an initial operation of the output ports at step 1006 of FIG. 10 may be performed according to the methods of FIGS. 11 and 12. According to the method of FIG. 11, control signals are coupled to predetermined output ports by loading one or more frames of configuration data at a step 1102. Tri-state buffer control signals of the predetermined output ports are overridden by setting, for each output port of the predetermined output ports, an initial value of a tri-state buffer control signal coupled to a tri-state buffer of the output port at a step 1104. As set forth above, setting an initial value of a tri-state buffer control signal is achieved by using configuration data of the one or more frames of configuration data which are sent first. Initial output values of the predetermined output ports are also set by coupling, for each output port of the predetermined output ports, an initial input value to the tri-state buffer at a step 1106. For each output port of the predetermined output ports, a tri-state output buffer control signal is coupled to the tri-state buffer after programming the programmable integrated circuit at a step 1108.

An alternate embodiment of enabling an initial operation of output ports of a programmable integrated circuit is shown in FIG. 12. In particular, a plurality of frames of configuration data for programming the programmable integrated circuit is received at a step 1202. A first set of frames of the plurality of frames of configuration data is loaded at a step 1204. Tri-state buffer control signals coupled to the predetermined output ports are overridden by setting, for each output port of predetermined output ports, an initial value of a tri-state buffer control signal coupled to a tri-state buffer of the output port using configuration data of the first set of frames at a step 1206. Initial output values of predetermined output ports of the programmable integrated circuit are also set using configuration data of the first set of frames at a step 1208. A DONE signal is generated at another output port of the programmable integrated circuit after loading the remaining frames of configuration data at a step 1210. Normal operation of the predetermined output ports is enabled after the configuration data has been loaded by enabling, in response to the DONE signal, the use of tri-state output buffer control signals coupled to the predetermined output ports at a step 1212.

It can therefore be appreciated that the new and novel methods of implementing output ports and an integrated circuit having programmable output ports has been described. It will be appreciated by those skilled in the art that numerous alternatives and equivalents will be seen to exist which incorporate the disclosed embodiments. As a result, the invention is not to be limited by the foregoing embodiments, but only by the following claims.

What is claimed is:

1. A method of implementing output ports of a programmable integrated circuit, the method comprising:
   loading a first set of configuration bits associated with a plurality of output ports, the first set of configuration bits including a control circuit configuration bit associated with a first output port of the plurality of output ports;
   coupling, by a control circuit in response to the first set of configuration bits; control signals to predetermined output ports of the integrated circuit, the control signals including a first output buffer control signal coupled to the first output port of the plurality of output ports while configuration data is loaded in the integrated circuit, wherein each output port of the plurality of output ports has an output buffer coupled to an output terminal;
   setting, by the control signals, initial output values of the predetermined output ports during programming of the programmable integrated circuit; and
   enabling, in response to a second buffer control signal coupled to the output buffer of the first output port after the configuration data is loaded, normal operation of the first output port after the programming of the programmable integrated circuit,
   wherein setting initial output values of the predetermined output ports comprises setting, for each output port of the predetermined output ports, an initial value of a tri-state buffer control signal coupled to a tri-state buffer of the output port.

2. The method of claim 1, wherein coupling control signals to predetermined output ports comprises loading a frame of the configuration data.

3. The method of claim 1, wherein setting initial output values of the predetermined output ports during programming of the programmable integrated circuit comprises overriding tri-state buffer control signals of the predetermined output ports.

4. The method of claim 3, wherein enabling the normal operation of the first output port comprises coupling the tri-state buffer control signals to the predetermined output port after programming the programmable integrated circuit.

5. The method of claim 1, wherein setting an initial value of a tri-state buffer control signal comprises selecting a fixed value as the tri-state buffer control signal.

6. The method of claim 1, wherein setting initial output values of the predetermined output ports comprises setting, for each output port of the predetermined output ports, an initial input value to the tri-state buffer.

7. A method of implementing output ports of a programmable integrated circuit, the method comprising:
   receiving a plurality of frames of configuration data for programming the programmable integrated circuit;
   loading a first set of frames of the plurality of frames, the first set of frames having configuration bits associated with a plurality of output ports, each output port having an output buffer coupled to an output terminal;
   setting, by a control circuit, initial output values of predetermined output ports of the plurality of output ports in response to loading the first set of frames;
   enabling normal operation of the predetermined output ports after the plurality of frames have been loaded; and
   generating a DONE signal at another output port of the programmable integrated circuit;
   wherein enabling normal operation of the predetermined output ports comprises enabling, in response to the DONE signal, the use of buffer control signals of the predetermined output ports.

8. The method of claim 7, further comprising coupling the predetermined output ports of the programmable integrated circuit to a plurality of devices of a circuit board.

9. The method of claim 8, further comprising coupling the DONE signal to the plurality of devices.

10. The method of claim 9, further comprising starting operation of at least one predetermined device of the plurality of devices before receiving the DONE signal.

11. An integrated circuit having programmable output ports, the integrated circuit comprising:
   an output port having an output buffer coupled to an output terminal;
   a control circuit coupled to the output buffer, the control circuit coupling, responsive to a control circuit configuration bit, a first output buffer control signal to the output buffer while configuration data is loaded in the integrated circuit and coupling a second output buffer control signal to the output buffer after the configuration data is loaded, wherein the control circuit configuration bit is loaded in a first set of configuration bits, of the configuration data, associated with the output port; and
   a configuration circuit enabling configure memory cells associated with input/output ports to be loaded in a first portion of the configuration data;
   wherein the control circuit generates the second output buffer control signal in response to a DONE signal.

12. The integrated circuit of claim 11, wherein the output buffer comprises a tri-state buffer.

13. The integrated circuit of claim 12, wherein the first output buffer control signal comprises a fixed signal coupled to a control terminal of the tri-state buffer.

14. The integrated circuit of claim 13, wherein the second output buffer control signal comprises a tri-state buffer control signal.

15. The integrated circuit of claim 11, further comprising a first register for setting the first output buffer control signal and a second register for setting an output at the output terminal while the configuration data is loaded.

* * * * *